US005693368A

United States Patent [19]
Ackerman et al.

[11] Patent Number: 5,693,368
[45] Date of Patent: Dec. 2, 1997

[54] LOW TEMPERATURE CHEMICAL VAPOR DEPOSITION METHOD FOR CLEANING SUBSTRATE AND DEPOSITING PROTECTIVE COATING

[75] Inventors: John Frederick Ackerman, Cheyenne, Wyo.; William Randolph Stowell, Rising Sun, Ind.; George Albert Coffinberry, West Chester, Ohio; John Herbert Wood, St. Johnsville; Adrian Maurice Beltran, Ballston Spa, both of N.Y.

[73] Assignee: General Electric Company, Schenectady, N.Y.

[21] Appl. No.: 715,052

[22] Filed: Sep. 17, 1996

Related U.S. Application Data

[63] Continuation of Ser. No. 526,332, Sep. 11, 1995, abandoned, which is a continuation of Ser. No. 315,807, Sep. 30, 1994, abandoned.

[51] Int. Cl.[6] ................................................. C23C 16/12
[52] U.S. Cl. .......................... 427/253; 427/250; 427/237; 427/238; 427/239; 427/124
[58] Field of Search ............................... 427/250, 253, 427/237, 238, 239, 124

[56] References Cited

U.S. PATENT DOCUMENTS 2,847,320  8/1958  Bulloff.

FOREIGN PATENT DOCUMENTS 02-078223  3/1990  Japan.
02-290974  11/1990  Japan.

OTHER PUBLICATIONS

Article —John L. Vossen, and Werner Kern, Chemical Vapor Deposition of Inorganic Thin Films, from the Text Thin Film Processes, Academic Press, (1978) pp. 258–331.

Patent Abstracts of Japan, vol. 015, No. 064 (C–0806) Feb. 15, 1991 —Abstract.

The Iron Age, vol. 196, No. 26, Dec. 23, 1965, pp. 5 & 53, "Aluminum 'Plating' Via Alkyl Gas", by J.C. Merriam.

Sasaoka et al, Appl. Phys. Lett. 55 (1989) p. 741.

*Primary Examiner*—Roy V. King
*Attorney, Agent, or Firm*—Noreen C. Johnson; William H. Pittman

[57] ABSTRACT

A method is disclosed to deposit aluminum coatings on high temperature superalloys for corrosion, oxidation, and erosion protection using low temperature chemical vapor deposition and an organometallic halide precursor, specifically an aluminum alkyl halide. The process is adapted to protective coatings for turbine parts having internal passages. Due to the lower temperatures used during chemical vapor deposition, a broad range of substrate materials can be utilized. The precursor vapors clean the substrate surfaces by removing native oxides while simultaneously depositing aluminum.

10 Claims, 1 Drawing Sheet

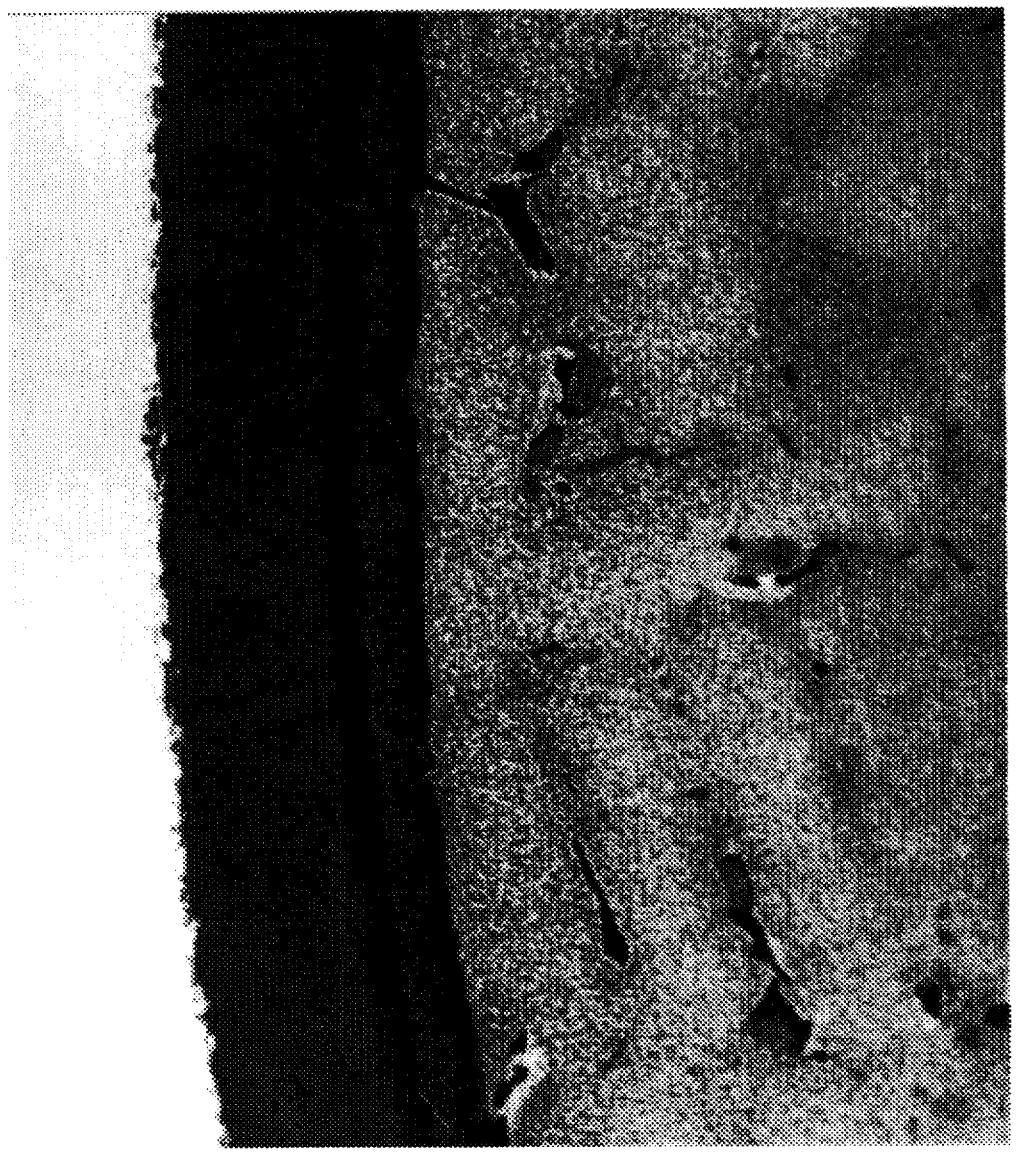

LOW TEMPERATURE CHEMICAL VAPOR DEPOSITION METHOD FOR CLEANING SUBSTRATE AND DEPOSITING PROTECTIVE COATING

This application is a continuation of application Ser. No. 08/526,332 filed Sep. 11, 1995, which is a continuation of the parent case Ser. No. 08/315,807, filed Sep. 30, 1994, both of them now abandoned.

CROSS-REFERENCE TO RELATED APPLICATION

This application is related to the following application which is commonly assigned and is incorporated herein by reference: J. F. Ackermann et al., "Method for Low Temperature Chemical Vapor Deposition of Aluminides Containing Easily Oxidized Metals," U.S. application Ser. No. 08/315,805, filed Sep. 30, 1994, now U.S. Pat. No. 5,503,874.

FIELD OF THE INVENTION

This invention relates to a method to deposit aluminum onto and into turbine parts by low temperature chemical vapor deposition, and more particularly, is related to cleaning the substrate surface while depositing aluminum by using an organometallic halide precursor.

BACKGROUND OF THE INVENTION

Chemical vapor deposition, herein sometimes referred to as CVD, coatings are used extensively in applications requiring resistance to wear, erosion, and corrosion, very often over a wide range of temperatures.

More often than not, the purpose of the coating is multifunctional. An example is the coating for a turbine blade to provide protection against wear and erosion of a corrosive environment at high temperature as well as protection against erosion by sand and other foreign particles. Various types of turbine hardware need to be protected from corrosion due to high temperature oxidation of the constituent alloy substrate. Aluminum is often the coating material chosen to protect the turbine blade involving the formation of aluminum oxide ($Al_2O_3$) and metal-aluminum oxide layers.

To date, several methods to coat the external surface of turbine blades have been developed. One method is pack cementation, which consists of packing a powder mixture around the part to be coated and then heating the part and mixture to coat the external surface with aluminum. This method, however, does not coat internal air cooling passages which are used in most turbine blade designs. When the blade design permits packing the internal air passages with the powder mixture, problems arise because the pack cementation materials are often difficult to remove, and the operation is labor intensive.

Aluminum coatings can also be applied to turbine blades by halogen CVD at high temperatures, such as 1100° C. Being a vapor deposition process, the internal blade passages are coated uniformly. However, this process is deficient in that high temperatures are needed for aluminum halide vaporization and reduction to occur. As a result, grain growth, creep, and other thermomechanical failure mechanisms can happen which decrease the strength and life of the blade.

Low temperature preparation of aluminum coatings has been previously described in VOSSEN and KERN, "Thin Film Processes," Academic Press, New York, 1978. In this process aluminum alkyls are used at temperatures between 200°–500° C. to deposit aluminum. Here, the aluminum is prone to poor adhesion and interdiffusion due to the inability of the reagent to penetrate the native oxide film surrounding the metal substrates.

There is a need for a process that uniformly coats the internal and external parts of turbine hardware by low temperature chemical vapor deposition. There is also a need for a low temperature CVD process that provides excellent adhesion of aluminum on a clean substrate surface.

SUMMARY OF THE INVENTION

The present invention fulfills these needs by providing a method to uniformly coat internal and external surfaces of a substrate with aluminum, said method comprising depositing by low temperature chemical vapor deposition at a temperature up to about 500° C., aluminum using an organometallic halide vapor as a precursor, where vapors of said precursor clean internal and external substrate surfaces while coating the substrate surfaces with aluminum.

The present invention is also directed toward a method for the deposition of aluminum on a metal substrate which comprises using aluminum alkyl halides as precursors in a low temperature chemical vapor deposition process for depositing aluminum on said substrate, and during said process, simultaneously stripping the native oxide coating from the substrate surface while depositing pure aluminum on the substrate surface.

In the above methods of the present invention, the aluminum is deposited by low temperature chemical vapor deposition. Such low temperature chemical vapor deposition is conducted in accordance with methods known to those skilled in the art. The term "low temperature" chemical vapor deposition, as used herein, means that the temperature of the chemical vapor deposition of aluminum is about 500° C. or lower, depending on the precursor chosen. In the practice of this invention, the use of a lower deposition temperature permits the use of a broader spectrum of substrates for the aluminum coating.

The time to deposit the aluminum is dependent on the desired thickness of the coating and the operational parameters chosen to run the low temperature chemical vapor deposition process. Generally, a thickness for the aluminum coating is specified per part or application and one skilled in the art is then able to ascertain the deposition parameters. As an example, for aluminum protective coatings on turbine parts exposed to in-service temperatures around 1100° C., a suitable thickness of deposited aluminum may be up to about 0.006 inches.

Important aspects of the present invention are the broad spectrum of substrate materials that can be utilized due to the low deposition temperature and the in-situ cleaning of the substrate surface while concurrently depositing the aluminum coating. By in-situ cleaning is meant that the part being coated with aluminum is simultaneously surface cleaned by the chosen precursor vapor during chemical vapor deposition of aluminum. This in-situ cleaning promotes improved adhesion and interdiffusion properties of the aluminum coating and the substrate.

Additional advantages of the present invention include the high throwing power of the CVD process, the uniform coverage of hard to reach internal passages of turbine parts due to the utilization of a flowing process, and the elimination of a heat treating step to regenerate the original substrate microstructure when high temperature CVD (about 1100° C.) is used.

BRIEF DESCRIPTION OF THE DRAWING

FIG. 1 is a photo of a microscopic picture of aluminum deposited on a nickel substrate in accordance with the method of the present invention and the subsequent formation of nickel aluminide after a diffusion heat treatment, said aluminide layer being about 0.004 inches thick.

DETAILED DESCRIPTION OF THE INVENTION

The method of the present invention provides a means of in-situ cleaning and aluminum coating of substrates made of high temperature turbine alloys during low temperature chemical vapor deposition. Such substrates include, but are not limited to, nickel based, cobalt based, and iron based alloys. The alloys may be cast or wrought superalloys. Examples of such substrates are GTD-111, GTD-222, Rene 80, Rene 41, Rene 125, Rene 77, Rene 95, Inconel 706, Inconel 718, Inconel 625, cobalt-based HS188, cobalt-based L-605, and stainless steels. The process is especially suited for coating parts and hardware used in turbines. An example of a turbine part would be a turbine blade.

Additional substrate materials, that can accommodate an aluminum coating for applications other than turbine parts, may be used in this invention. For instance, it is also contemplated that this invention may be utilized for aluminum coatings in marine environments, electronic applications, and power generators, such as gas, steam, and nuclear, to mention a few.

The present invention is applicable to any known process for the low temperature chemical vapor deposition of aluminum on a substrate. The following detailed description of the invention referring to one type of vapor deposition process is representative of the practice of the invention using other types of conventional low temperature CVD processes with aluminum alkyl halides. The aluminum alkyl halide can be a chloride, bromide or iodide compound so long as it is stable at about 25° C.

In the practice of the present invention, low temperature chemical vapor deposition is used with an aluminum alkyl halide as a precursor to deposit aluminum on a substrate, preferably a metal substrate that is a nickel or cobalt based alloy. The metal substrate must be thick enough to later form a metal aluminide layer on its surface. Depending on the metal substrate, the metal aluminide forms after the deposition of aluminum by low temperature chemical vapor deposition and subsequent interdiffusion of the aluminum and the substrate base metal during heat treatment.

The temperature employed during the chemical vapor deposition process is about 500° C. or less, with the preferred range between about 100°–500° C., and the most preferred range between about 280°–420° C.

An example of a CVD apparatus for the practice of this invention consists of an effusion cell with plumbing fixtures capable of volatilizing and bringing to the substrate a sufficient quantity of the aluminum reagent (precursor) to coat the substrate with aluminum. Herein, the term "substrate" includes one or more substrates to be coated at the same time. The apparatus has an airtight reactor volume which contains the substrate and a heating means for the substrate. The heating means is chosen from conventional methods known to those skilled in the art, including, but not limited to, resistive heating, induction heating by radio frequency (RF), and fuel fired furnaces. Additionally, the CVD apparatus has a system of traps, condensers, and vacuum pumps capable of maintaining a vacuum in the reactor and effusion cell during the process. The substrate is fixed to the effusion cell outlet in a manner as to force a majority of the reagent through the internal passages of the substrate. Common engineering principles, known in the art, can be used for this purpose.

In a normal run of the CVD process, the substrate is placed in the reactor, the reactor evacuated to 10–15 millitorr (mtorr) pressure to remove oxygen, and then heated to the reaction temperature. After the reactor is evacuated, the process may be run at a pressure between about 10 millitorr to about 10 torr. A preferred range is between about 100–500 millitorr.

The reaction temperature is dependent on the precursor chosen and its volatilization temperature. Different organic halides vaporize at different temperatures. For instance, when diethyl aluminum chloride is the precursor, the chemical vapor deposition temperature is chosen between about 300°–400° C. The vaporization temperatures of aluminum alkyl halides can be obtained from chemical handbooks displaying physical properties of chemical compounds.

When the reactor is at the selected reaction temperature, the effusion cell is then opened and the aluminum alkyl halide vapors pass through the plumbing into the heated zone. Upon passing into the heated zone, the vapors surround the external portions of the substrate and penetrate the internal substrate passages. The present invention results in the vapors simultaneously stripping the native oxide from the substrate surface while depositing pure aluminum thereon. The deposition conditions are sustained until the desired thickness of aluminum is deposited.

The following examples further demonstrate the invention.

EXAMPLE 1

Using the method described above, three types of substrates were used to deposit aluminum. The three sample substrates were burner-rig test pins of nickel alloy GTD-111, copper metal coupons, and fused silica windows. All of the sample substrates were placed in a low temperature chemical vapor deposition reactor at the same time. The reactor was evacuated and heated to 400° C. at which point vapors of diethyl aluminum chloride were passed over these substrates at a pressure of 100–500 mtorr. This was continued for eight hours, after which the reagent flow was stopped and the reactor cooled. The aluminum coating was about 0.004 inches thick on the surface of the substrates.

The nickel alloy burner-rig pins with the aluminum coating were then heated under high vacuum to interdiffuse the deposited aluminum and the nickel alloy. The heat treatment was performed by ramping or increasing the temperature up to 1120° C. over a period of forty-five minutes, maintaining the heat treatment at 1120° C. for two hours, and then decreasing the temperature from 1120° C. to room temperature over a period of one hour. The pins were then cut in cross section and examined by microscopy. A photo taken at 400X magnification using microscopy shows the formation of the nickel aluminide layer on the sample pin coated with aluminum and heat treated. This is displayed in FIG. 1. It should be noted that if a cobalt based alloy is used in place of a nickel based alloy, then the aluminum coating would form a cobalt aluminide layer after heat treatment.

The copper coupons placed in the CVD reactor were not heat treated to interdiffuse the aluminum and copper substrate because interdiffusion took place at the CVD deposition temperature. Examination of the copper coupons with the aluminum coating showed the formation of copper-aluminum alloys on the surface with no discernible oxide interface present. This demonstrates the removal of the native oxide from the substrate surface by diethyl aluminum chloride. Furthermore, a 0.1 gram per square inch area weight loss on the copper substrate was measured which additionally demonstrates the cleaning quality of the mixed halide alkyl reagent.

The silica substrate from the above process showed a layer of aluminum on the silica surface. Since silica is an oxide, no removal of native oxides was shown.

EXAMPLE 2

A second low temperature chemical vapor deposition of aluminum was made in which a turbine bucket was fixed to the effusion cell so as to force most of the reagent into the internal passages. The bucket was evacuated and heated as above with the diethyl aluminum chloride vapors flowing through the bucket. After twelve hours, the flow was discontinued and the substrate cooled. After high temperature diffusion treatment, under the same conditions as above stated, the bucket was cut in cross section and the internal coating was examined.

What is claimed is:

1. A method to in-situ clean and simultaneously deposit aluminum on surfaces of a hollow metal substrate consisting of: cleaning native oxides from the surfaces of the hollow metal substrate with vapors from an aluminum alkyl chloride precursor by low temperature chemical vapor deposition at a temperature up to about 500° C.; and depositing simultaneously aluminum in a sufficient amount to subsequently form an aluminide with the metal substrate after diffusion heat treatment.

2. A method according to claim 1 where said substrate is selected from the group consisting of a nickel based alloy, a cobalt based alloy, and a iron based alloy and is a turbine part.

3. A method according to claim 1 where said aluminum alkyl chloride is diethyl aluminum chloride.

4. A method according to claim 1 where the temperature for depositing aluminum is between about 280°–420° C.

5. A method according to claim 2 where the turbine part is a bucket having internal passages.

6. A method according to claim 1 where the aluminum coating has a thickness of about 0.006 inches.

7. A method to clean and uniformly deposit aluminum on internal and external surfaces of a hollow metal substrate consisting essentially of: using aluminum alkyl chlorides as precursors in a low temperature chemical vapor deposition process at a temperature up to about 500° C.; and depositing aluminum on the surfaces of said hollow metal substrate while simultaneously stripping native oxides from the surfaces of said hollow metal substrate.

8. A method according to claim 7 where said substrate is selected from the group consisting of a nickel based alloy, a cobalt based alloy, and a iron based alloy and is a turbine part.

9. A method according to claim 7 where said aluminum alkyl chloride is diethyl aluminum chloride.

10. A method according to claim 7 where said temperature is between about 280°–420° C.

* * * * *